United States Patent
Jeng et al.

(10) Patent No.: US 9,633,954 B2
(45) Date of Patent: *Apr. 25, 2017

(54) METHODS OF MANUFACTURING AN INTEGRATED CIRCUIT HAVING STRESS TUNING LAYER

(71) Applicant: Taiwan Semiconductor Manufacturing Company, Ltd., Hsin-Chu (TW)

(72) Inventors: Shin-Puu Jeng, Hsin-Chu (TW); Clinton Chao, Redwood Shores, CA (US); Szu Wei Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/056,615

(22) Filed: Feb. 29, 2016

(65) Prior Publication Data

US 2016/0181209 A1 Jun. 23, 2016

Related U.S. Application Data

(60) Continuation of application No. 13/730,611, filed on Dec. 28, 2012, now Pat. No. 9,275,948, which is a
(Continued)

(51) Int. Cl.
*H01L 23/495* (2006.01)
*H01L 23/00* (2006.01)
(Continued)

(52) U.S. Cl.
CPC .......... *H01L 23/562* (2013.01); *H01L 21/302* (2013.01); *H01L 21/314* (2013.01);
(Continued)

(58) Field of Classification Search
CPC ... H01L 21/302; H01L 21/314; H01L 21/316; H01L 21/3185; H01L 23/52;
(Continued)

(56) References Cited

U.S. PATENT DOCUMENTS 5,016,080 A  5/1991  Giannella
5,661,345 A * 8/1997  Wada ............... H01L 21/28512
                                                    257/767
(Continued)

FOREIGN PATENT DOCUMENTS

TW         481904       4/2002
TW      200409586 A     6/2004
(Continued)

*Primary Examiner* — Thanh T Nguyen
(74) *Attorney, Agent, or Firm* — Slater Matsil, LLP

(57) ABSTRACT

Warpage and breakage of integrated circuit substrates is reduced by compensating for the stress imposed on the substrate by thin films formed on a surface of the substrate. Particularly advantageous for substrates having a thickness substantially less than about 150 μm, a stress-tuning layer is formed on a surface of the substrate to substantially offset or balance stress in the substrate which would otherwise cause the substrate to bend. The substrate includes a plurality of bonding pads on a first surface for electrical connection to other component.

20 Claims, 8 Drawing Sheets

Related U.S. Application Data continuation of application No. 12/983,967, filed on Jan. 4, 2011, now Pat. No. 8,367,474, which is a division of application No. 11/435,436, filed on May 16, 2006, now Pat. No. 7,880,278.

(51) Int. Cl.

| | | |
|---|---|---|
| *H01L 21/302* | (2006.01) | |
| *H01L 21/314* | (2006.01) | |
| *H01L 21/316* | (2006.01) | |
| *H01L 21/318* | (2006.01) | |
| *H01L 23/52* | (2006.01) | |
| *H01L 21/56* | (2006.01) | |
| *H01L 21/78* | (2006.01) | |
| *H01L 23/58* | (2006.01) | |

(52) U.S. Cl.
CPC ........ *H01L 21/316* (2013.01); *H01L 21/3185* (2013.01); *H01L 21/563* (2013.01); *H01L 21/78* (2013.01); *H01L 23/52* (2013.01); *H01L 23/585* (2013.01); *H01L 24/48* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/00014* (2013.01); *H01L 2924/01019* (2013.01); *H01L 2924/01078* (2013.01); *H01L 2924/01327* (2013.01); *H01L 2924/09701* (2013.01); *H01L 2924/10253* (2013.01); *H01L 2924/13091* (2013.01); *H01L 2924/14* (2013.01)

(58) Field of Classification Search
CPC ......... H01L 23/562; H01L 2224/32245; H01L 2224/48091; H01L 2224/48247; H01L 2224/48465; H01L 2224/73265; H01L 23/585; H01L 24/48; H01L 2924/01019; H01L 2924/010178; H01L 2924/01327; H01L 2924/09701; H01L 2924/10253; H01L 2924/13091; H01L 2924/00014; H01L 2924/00

See application file for complete search history.

(56) References Cited

U.S. PATENT DOCUMENTS

| | | |
|---|---|---|
| 5,877,034 A | 3/1999 | Ramm et al. |
| 6,387,795 B1 | 5/2002 | Shao |
| 6,562,647 B2 | 5/2003 | Zandman et al. |
| 6,621,147 B2 | 9/2003 | Ball |
| 6,936,763 B2 | 8/2005 | Rizzo et al. |
| 6,946,328 B2 | 9/2005 | Kim et al. |
| 7,271,439 B2 | 9/2007 | Park |
| 7,466,031 B2 | 12/2008 | Huang |
| 8,367,474 B2 * | 2/2013 | Jeng ................ H01L 21/302 257/E23.031 |
| 2004/0018392 A1 | 1/2004 | Yoder |
| 2004/0089222 A1 | 5/2004 | Motoki et al. |
| 2004/0251520 A1 | 12/2004 | Sasaki et al. |
| 2005/0037537 A1 | 2/2005 | Kim et al. |
| 2005/0116350 A1 | 6/2005 | Ng et al. |
| 2005/0133854 A1 | 6/2005 | Park |
| 2005/0174012 A1 | 8/2005 | Ozaki et al. |
| 2006/0051938 A1 | 3/2006 | Connell et al. |
| 2007/0181992 A1 * | 8/2007 | Lake ................ H01L 21/563 257/698 |
| 2007/0257373 A1 | 11/2007 | Akram et al. |
| 2007/0267752 A1 | 11/2007 | Park |

FOREIGN PATENT DOCUMENTS

| | | |
|---|---|---|
| TW | 244725 B | 12/2005 |
| TW | 200539389 A | 12/2005 |
| TW | 251338 B | 3/2006 |
| TW | 278277 B | 4/2007 |

* cited by examiner

METHODS OF MANUFACTURING AN INTEGRATED CIRCUIT HAVING STRESS TUNING LAYER

This application is a continuation of U.S. patent application Ser. No. 13/730,611, entitled "Integrated Circuit Having Stress Turning Layer," filed on Dec. 28, 2012, which is a continuation of U.S. patent application Ser. No. 12/983,967, entitled "Method of Manufacturing Integrated Circuit Having Stress Tuning Layer," filed on Jan. 4, 2011, now U.S. Pat. No. 8,367,474 issued on Feb. 5, 2013, which is a divisional of U.S. patent application Ser. No. 11/435,436, entitled "Integrated Circuit Having Stress Tuning Layer," filed on May 16, 2006, now U.S. Pat. No. 7,880,278 issued on Feb. 1, 2011, which applications are incorporated herein by reference.

FIELD OF THE INVENTION

This invention relates to integrated circuits generally and more particularly to methods and structures for forming integrated circuits having very thin semiconductor substrates.

BACKGROUND OF THE INVENTION

As is well known in the art, most integrated circuits are manufactured on wafers, typically semiconductor wafers, and more typically silicon wafers. Over the past decades, wafers have grown from a mere two inches in diameter to eight inches in diameter and, more recently, twelve inches in diameter, also known as 300 mm wafers. While most devices manufactured today are manufactured on eight inch wafers, most new integrated device manufacturing facilities will be designed to manufacture on twelve inch wafers.

As the area of a circle is related to the square of its diameter, a fifty percent increase in the diameter (as in moving from an eight inch wafer to a twelve inch wafer) results in more than doubling of the available surface area for manufacturing devices.

Another trend in integrated circuit device manufacturing relates to packaging technology. With the move toward surface mount technology and so called low profile packages, wafers are being ground to increasingly lesser thicknesses as part of the packaging process.

As wafers become larger in diameter and thinner in thickness, previously unknown or at least unappreciated forces play an increasingly important role. These forces include the compressive or tensile stress applied to the wafer by the thin films that are formed thereon as part of the integrated circuit manufacturing processes. Such thin films include dielectric layers, such as so-called inter-layer dielectric ("ILD"), inter-metal dielectric ("IMD"), etch stop layers, passivation layers, and the like, and include conductive layers such as doped polysilicon layers and metal interconnect layers. With modern integrated circuit devices having seven, eight, and even more metal interconnect layers, with the commensurate IMD layers, etch stop layers, and passivation layers at the upper level, twenty or more thin films are typically formed on new generation integrated circuit wafers.

The combination of a greater number of thin films applying stress to thinner wafers results in significant warpage of the wafer and of the subsequently formed integrated circuits (as is known, the wafers are diced into individual chips that, when packaged, form a complete integrated circuit device). FIG. 1a illustrates warping of a semiconductor wafer 2 resulting from the stress applied on the wafer by overlying thin films 4. For purposes of illustration, the multiple conductive, dielectric, and semiconductive films formed over wafer 2 are schematically illustrated as a single layer 4. As described above, these films cumulatively impose a stress on underlying wafer 2 which can cause wafer 2 to warp. The nominal, i.e., non-warped, profile for wafer 2 is illustrated by dotted line 6. The amount of warpage is shown exaggerated for purposes of illustration.

Once wafer 2 is diced into individual chips, or die, the individual die are also warped by the stress imposed by films 4. FIG. 1b illustrates in exaggerated detail the deviation from nominal (dotted line 12) for an exemplary integrated circuit chip 8 warped by stress imposed by films 4.

The warpage caused by films 4 has several deleterious effects. One such effect is an increased difficulty in handling and increased likelihood of breakage for wafer 2 during assembly processes. Another negative effect is that the warpage of chip 8 can significantly impact the electrical performance of the devices formed on chip 8. As is known, strain in the semiconductor layer in which MOS transistors are formed can significantly impact charge carrier mobility. The strain caused by warpage of chip 8 can adversely impact charge carrier mobility.

What is needed, therefore, is a method and structure for overcoming the above described shortcomings in the prior art.

SUMMARY OF THE INVENTION

In one aspect, the present invention provides for an integrated circuit having a semiconductor substrate, a plurality of films formed on a surface of the substrate, the films imposing a stress on the substrate, and a stress tuning layer formed on the surface of the substrate, the stress tuning layer at least partially off-setting the stress imposed by the films. In one embodiment, the stress tuning layer is formed on an opposite surface of the substrate. In another embodiment, the stress tuning layer is formed on the same surface of the substrate as the films.

In another aspect, the present invention provides for a semiconductor device including a semiconductor substrate having a thickness of less than about 150 microns. The device includes a plurality of devices formed on a first surface of the substrate and a plurality of boding pads overlying the first surface. The device also includes a stress tuning layer formed on the second surface of the substrate.

In yet another aspect, the present invention provides for a method of manufacturing an integrated circuit. The method includes providing a semiconductor substrate having a first thickness and forming a plurality of films on the substrate. The method further includes thinning the substrate to a second thickness and forming a stress tuning layer on a surface of the substrate. In some embodiments of the invention, the stress tuning layer is formed on the back surface of the substrate after the thinning step. In other embodiments, the stress tuning layer is formed on a front surface of the substrate, either before or after the thinning step.

In yet another aspect, the present invention provides for a method for forming a semiconductor structure comprising providing a semiconductor substrate having a first surface and a second surface, the semiconductor substrate comprising a plurality of dies and forming a series of layers on a first surface of the substrate, the layers imposing strain on the semiconductor substrate. A stress-tuning layer is formed overlying one of the first and the second surface to substantially offset the strain caused by the layers, and a slot is formed in the stress-tuning layer to adjust the amount of stress being offset, the slot extending over at least two of the plurality of dies.

In yet another aspect, the present invention provides for a method of forming a semiconductor structure comprising forming a first layer over a semiconductor substrate, the semiconductor substrate comprising a die, and forming a stress-tuning layer on one of the first surface or the second surface. A first portion of the stress-tuning layer is removed to form an opening, the opening extending over and beyond the die.

In yet another aspect, the present invention provides for a method of forming a semiconductor device comprising forming a contact pad over a semiconductor substrate and forming a plurality of films over a first side of the semiconductor substrate. A stress-tuning layer is formed over the semiconductor substrate and the stress in the stress-tuning layer is adjusted by forming slots within the stress-tuning layer, wherein the slots are void of conductive material and wherein the slots are formed to have a length greater than the contact pad.

In yet another aspect, the present invention provides a semiconductor structure comprising a semiconductor substrate having a first surface and a second surface, the semiconductor substrate comprising a plurality of dies and a metallic stress-tuning layer formed on the semiconductor substrate, the metallic stress-tuning layer comprising openings to adjust an amount of stress, at least one of the openings extending over at least two of the plurality of dies.

In yet another aspect, the present invention provides a semiconductor structure comprising a semiconductor wafer with a first inherent stress, the semiconductor wafer comprising a plurality of dies, at least one of the plurality of dies comprising a contact pad over a first surface of the semiconductor wafer. A stress-tuning layer is on the semiconductor wafer, the stress-tuning layer having a second inherent stress opposite the first inherent stress, and slots are located within the stress-tuning layer, the slots having a length greater than a contact pad and aligned with one or more crystalline planes of the semiconductor wafer.

In yet another aspect, the present invention provides a semiconductor structure comprising a semiconductor substrate comprising a plurality of dies and a passivation layer over a first side of the semiconductor substrate. A stress-tuning layer over the passivation layer, the stress-tuning layer comprising slots, the slots extending over at least two of the plurality of dies.

Advantageous features of the prevent invention include the ability to tune the amount of stress applied on the semiconductor wafer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 2A:
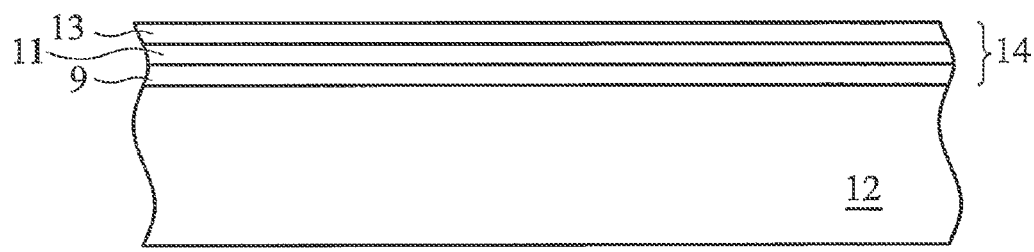
FIGS. 2a through 2c illustrate in cross section steps in the manufacture of a first illustrative embodiment of the present invention.
Figure 2B:
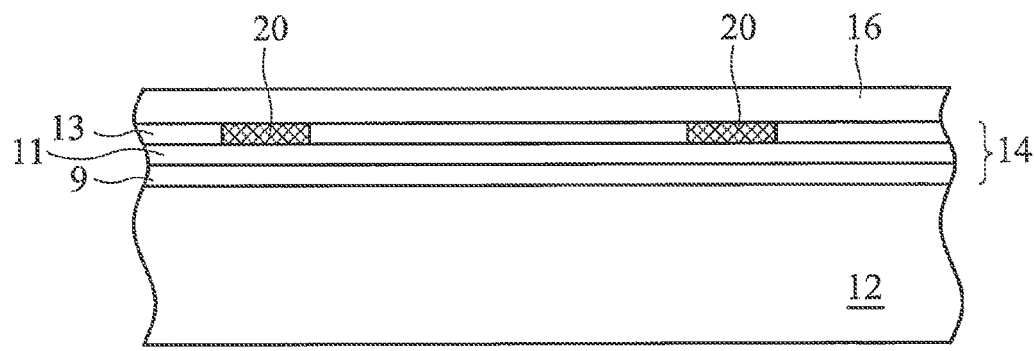
Figure 2C:
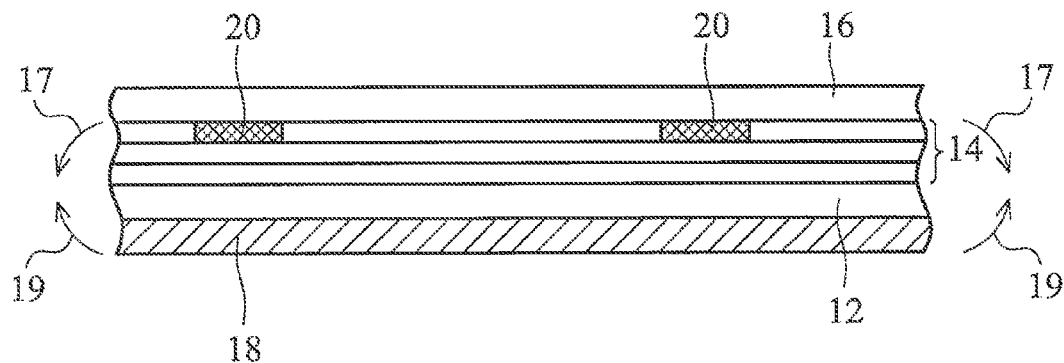

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention FIGS. 2a through 2c illustrate in cross-sectional detail an illustrative embodiment of the present invention. Semiconductor wafer 12 has formed thereon a plurality of layers 9, 11, 13, which layers are collectively referred to herein as film or films 14. Although only three layers are shown for illustration, one skilled in the art will recognize that any number of layers may be formed on wafer 12 (sometimes alternatively referred to herein as substrate 12) during the process of manufacturing an integrated circuit. In the illustrative embodiments, wafer 12 is a bulk silicon wafer as is common in the art of, perhaps 8 inches, 12 inches, or even 16 inches in diameter. Typically bulk silicon wafer 12 is about 620 μm (about 31 mils) thick during the integrated circuit manufacturing process. In other embodiments, wafer 12 may be formed of a thin semiconductor layer formed on a buried oxide (box) layer, which in turn is formed on a bulk substrate such as silicon. This so-called silicon on insulator (SOI) configuration is well known in the art and so the details are not illustrated in the figures.

Film 14 is composed of numerous layers, sometimes referred to as thin films, that are formed as part of a typical manufacturing process for forming an integrated circuit. As is known in the art, integrated circuits are typically formed of doped regions (not shown) formed at least partially in an upper surface of the substrate 12. Various layers are then formed atop of substrate 12 and patterned to complete the integrated circuit manufacturing process. These thin films include, e.g., one or more doped polysilicon layers that may be used to form gate electrodes, a contact etch stop layer, a inter-layer dielectric layer (ILD), inter-metal dielectric layers (IMDs), metallic interconnect layers, etch stop layers, and the like. Commonly a passivation layer is formed atop the structure to protect the integrated circuit from contamination, moisture, and the like. In a typical integrated circuit having eight metallization layers and the concomitant IMD and etch stop layers, more than twenty different thin films may be formed on the wafer surface during manufacturing.

Figure 1A:
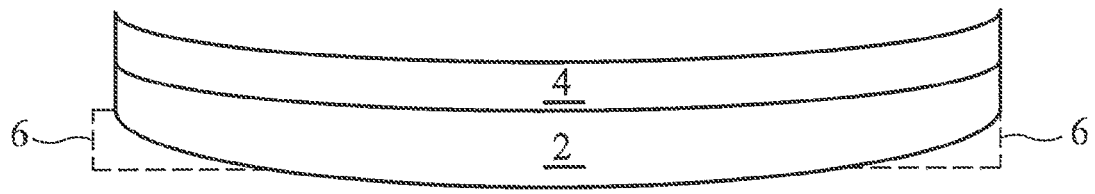
FIGS. 1a and 1b illustrate warping of a semiconductor substrate and an integrated circuit chip, respectively, arising from stress imposed by overlying thin films.
Figure 1B:
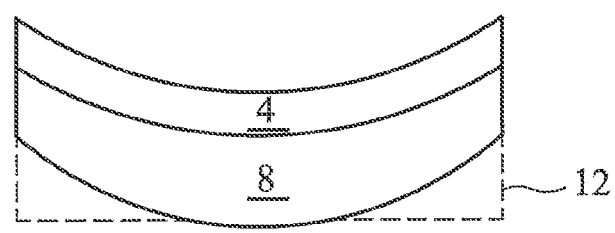

The films that comprise collective film 14 are deposited in a variety of manners, including chemical vapor deposition (CVD), plasma enhanced vapor deposition (PEVD), atomic layer deposition (ALD), sputtering, electro-plating, electroless plating, and the like. The films are deposited at elevated temperatures, typically at 400 C or more. During deposition, the respective films generally do not impose a stress on the underlying layer. After the deposition process, however, as the device returns to room temperature, the different coefficients of thermal expansion between the wafer and the respective thin films formed on the wafer come into play. Due to the different coefficients of thermal expansion and the modulus of the respective thin films, stress arises in the films and a complimentary stress is imposed on the underlying wafer. It is this stress that causes the wafer and subsequently formed die to warp, as shown in FIGS. 1a and 1b, respectively.

One skilled in the art will recognize that certain component films of composite film 14 will impose an inherent compressive stress on underlying wafer 12. Other component films may impose an inherent tensile stress on wafer 12. Hence, the stress caused by one film might tend to counterbalance or negate the effects of the stress caused by another film. Empirical evidence suggests, however, that with conventional integrated circuit processes, particularly for MOS processing, the collective stresses of the composite films will cause film 14 to impart an overall tensile stress on underlying silicon wafer 12. The magnitude of this stress will depend upon the composition and deposition parameters for the individual layers of film 14 as well as upon the composition of wafer 12. In some embodiments, however, film 14 may impart a compressive stress on underlying wafer 12.

As illustrated in FIG. 2a, wafer 12 has a thickness, typically around 620 µm (31 mils). Traditionally, integrated circuits provided satisfactory performance with a wafer having such a thickness. The wafer would be sawed into individual chips, and these individual chips would typically be mounted onto a supporting lead frame before being encapsulated. In emerging technologies, however, it is desirable to considerably thin the wafer thickness prior to packaging.

FIG. 2b illustrates the wafer of FIG. 2a after a protective film 16, often called blue tape or UV tape, has been formed over the top surface, sometimes referred to as the front service, of the semiconductor device. Note that this occurs after the integrated circuit has been fully manufactured, including the formation of metallization layers and a passivation layer, as is well known in the art. FIG. 2b also schematically illustrates exemplary bond pads 20 formed in a top film(s) of the device. As is known in the art, these bond pads 20 are electrical contact points for electrically connecting the integrated circuit device to the outside world. Bond pads 20, which are formed before applying protective film 16, may also impose additional tensile or compressive stress on wafer 12. Protective film 16 is applied to the device to protect the integrated circuit from mechanical stress and from contamination during the subsequent back grinding process. Next, as is known in the art, wafer 12 is backgrounded, or polished, to decrease the wafer's thickness. This back grinding can be accomplished in a number of well-known ways and the specifics are not necessary for an understanding of the present invention.

The result of the back grinding or polishing step is illustrated in FIG. 2c, wherein wafer 12 has been reduced to a thickness of no more than perhaps 75 µm (3 mils) to perhaps less than 50 µm (2 mils) or even 25 µm (1 mil). Note that protective film 16 remains on the device even after the back grinding process. Protective film 16 provides mechanical support to the wafer and prevents the warping that would otherwise occur due to the stress of film 14. Next, and as further illustrated in FIG. 2c, stress tuning layer 18 is formed on the back side, or bottom side, of wafer 12. In this embodiment, stress tuning layer 18 is formed on the surface of wafer 12 opposite from the surface on which is formed layer 14.

In an illustrative embodiment, layer 14 imposes an inherent tensile stress on wafer 12. If left unopposed, this tensile stress would tend to bow or warp wafer 12 in the manner illustrated in FIG. 1a, as illustrated by deflection arrows 17 in FIG. 2c. As discussed above, protective film 16 presents this bowing from occurring, but protective film 16 has to be removed in order to complete the packaging of the integrated device. Therefore, stress tuning layer 18 is preferably formed on the backside of wafer 12 prior to removal of protective film 16. Stress tuning layer is selected and deposited to that it also imparts an inherent tensile stress on wafer 12. This tensile stress is imparted on the opposite surface as the stress imparted by film 14, however, as shown by deflection arrows 19. As is schematically illustrated by the deflection arrows 17, 19, the stress imparted by stress tuning layer 18 tends to negate or counter-balance the stress caused by films 14. The result is that wafer 12, and the subsequently formed chips when wafer 12 is sawed apart, is much less prone to warping. After stress tuning layer 18 is formed, protective film 16 can be removed and packaging can continue.

One skilled in the art will recognize that a variety of materials and deposition techniques can be employed for forming stress tuning layer 18 on the backside of wafer 12. Recall that one of the driving motivations behind the present invention is the desire to decrease the overall thickness of the resulting integrated circuit. For this reason, it is preferable that stress tuning layer be as thin as possible, while still offsetting the effects of film 14. In the illustrative embodiments, stress tuning layer 18 has a thickness of less than about 20 µm. Dielectric materials such as silicon nitride, silicon oxide, silicon oxynitride, and the like are good candidates for stress tuning layer 18, as these materials and methods for depositing them are well known and common in the industry. Silicon nitride, in particular, has stress properties that can be relatively well controlled through the deposition techniques employed. Alternatively, other dielectrics such as low-k dielectric, polyimide, glass, plastic, ceramic, molding compound, and the like could be employed. Exemplary low-k dielectrics include carbon-doped silicon oxide, fluorine-doped silicon oxide, silicon carbide.

In still other embodiments, a conductive material such as nickel, chromium, or the like could be employed for stress tuning layer 18. Such materials may provide added benefits such as better thermal conductivity and enhanced grounding capacity for the wafer. Generally, it is desirable that whatever material is selected, stress tuning layer be deposited at a temperature of below about 400 C. This is particularly significant because of the need to stay within a pre-defined thermal budget, as is known in the art, in order to, e.g., avoid excessive migration of doped impurity regions.

Various techniques can be employed for depositing stress tuning layer 18, including CVD, PECVD, spin-on coating, and the like. After stress tuning layer 18 is formed, protective film 16 can be removed without concern for warpage of wafer 12. Once protective film 16 is removed, and after a subsequent dicing step, electrical contact can be made to bond pads 20.

In some embodiments, electrical contact made is by wire bonding to the bond pads. In other embodiments, electrical contact can be made by placing the device over a substrate upon which solder bumps have been formed, aligned with the placement of contact pads 20 in the so-called flip chip configuration.

Stress tuning layer can remain blanket deposited onto wafer 12, or stress tuning layer can be formed and subsequently patterned. Patterning stress tuning layer 18 can be employed to further tune or adjust the stress imposed upon wafer 12. For instance, it may be desirable to pattern slots in stress tuning layer in order to concentrate or reduce the amount of stress being applied to select regions of wafer 12. In other embodiments, stress tuning layer may be removed from the portions of wafer 12 corresponding to the scribe lines (being the lines along which wafer 12 will ultimately be sliced to form the individual chips). This approach may be particularly advantageous in order to reduce the possibility that stress tuning layer 18 will peal, crack, or delaminate as a result of the mechanical stresses imposed during the sawing process.

Figure 3A:
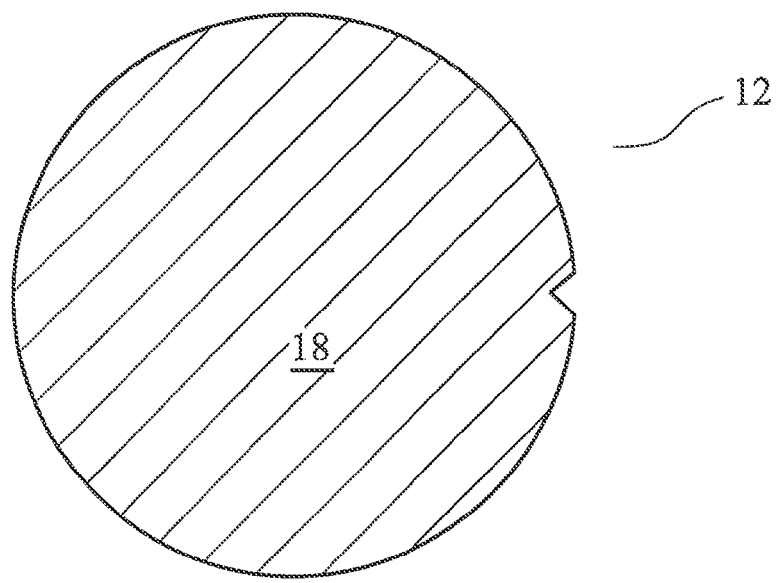
FIG. 3a through 3c illustrate in plan view the bottom side of an exemplary wafer having a stress tuning layer on the bottom side.
Figure 3B:
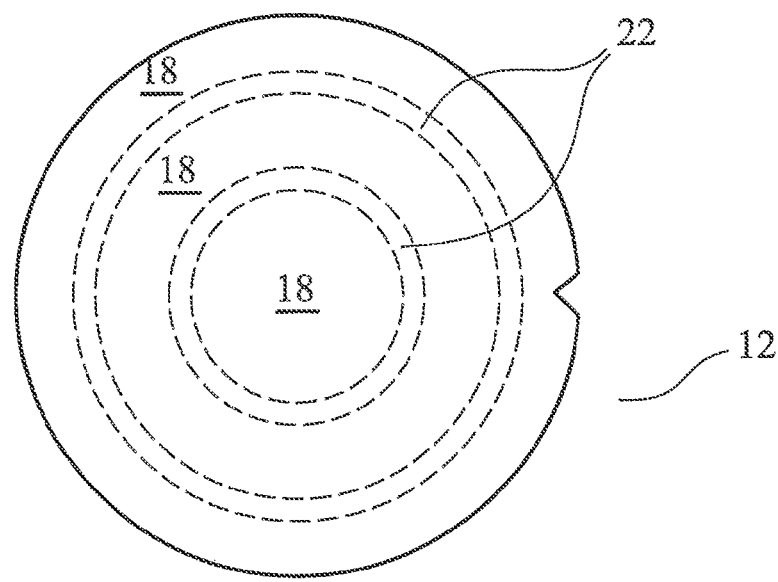
Figure 3C:
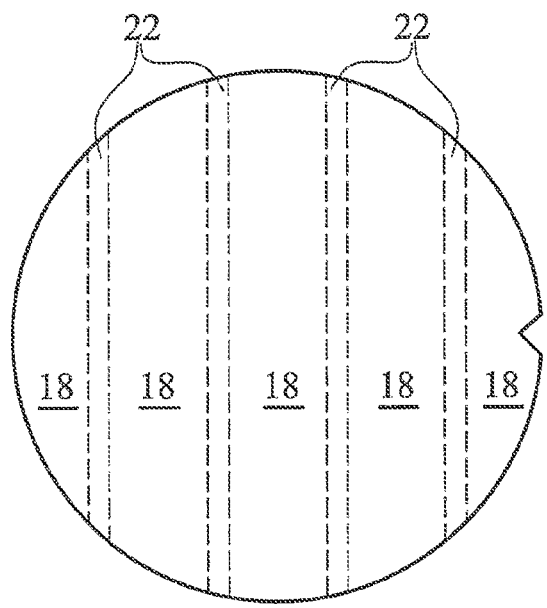

FIG. 3a illustrates in plan view the back side or bottom side of wafer 12 after stress tuning layer 18 has been blanket deposited. FIGS. 3b and 3c illustrates in plan view the back side of wafer 12 after stress tuning layer has been patterned as described above. In FIG. 3b, trenches 22 in the form of concentric rings are formed in stress tuning layer, thus dividing stress tuning layer into concentric annular regions. A variation of FIG. 3b might involve removing stress turning layer entirely from the central portion of wafer 12 and leaving one (or more) large annular region around the periphery of wafer 12, where the effects of warpage are likely to be greatest. FIG. 3c illustrates yet another variation. In this example, trenches 22 are formed in parallel lines across wafer 12, thus forming stress tuning layer 19 into a series of parallel strips running across wafer 12. Other examples include checker board type patterns formed in stress tuning layer 18 and removing stress tuning layer from the periphery of the wafer or the periphery of individual chips. Due to the crystalline nature of wafer 12, it may be that wafer 12 is more prone to warping or strain in one direction as opposed to another direction. This can be accommodated that patterning stress tuning layer 18 in so that the stress tuning layer patterns are substantially aligned with one or more crystalline planes or orientations of the wafer. Numerous variations to the illustrated patterns will become apparent to one of skill in the art with routine experimentation and are within the contemplated scope of the present invention. Stress tuning effects can be adjusted by controlling the thickness of the stress tuning layer in combination with patterning or removing portions of the stress tuning layer. While illustrative patterns have been discussed, many other patterns are possible, including specialized patterns, which may be empirically derived, to match localized stress requirements.

Figure 3D:
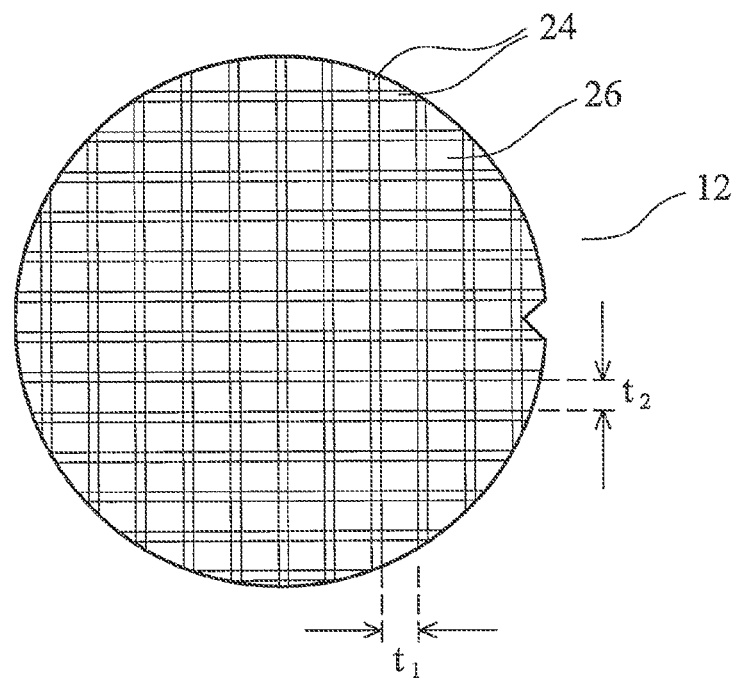
FIG. 3d illustrates in plan view the top side of an exemplary wafer having a stress tuning layer on the bottom side.

FIG. 3d schematically illustrates the top side or front side of wafer 12, the side whereon the integrated circuit devices are formed, in plan view. Note that this is the opposite side of the wafer illustrated in FIGS. 3a through 3c. FIG. 3d illustrates scribe lines 24 running across wafer 12. These scribe lines 24, define the dimensions of the individual chips 26 into which wafer 12 will be sawed, as is known in the art. It is believed that embodiments of the present invention will have particularly beneficial impact on relatively large chips 26. For instance, chips having a width $t_1$ of about 20 mm or greater and a width $t_1$ of about 20 mm or greater is particularly prone to warpage resulting from the stress imposed by films 14. While the present invention is not necessarily limited to chips of such dimensions, it is believed that the present invention would be particularly advantageous for chips having dimensions of about 20×20 mm, or greater, and having a thickness of about 150 μm or less.

Figure 4A:
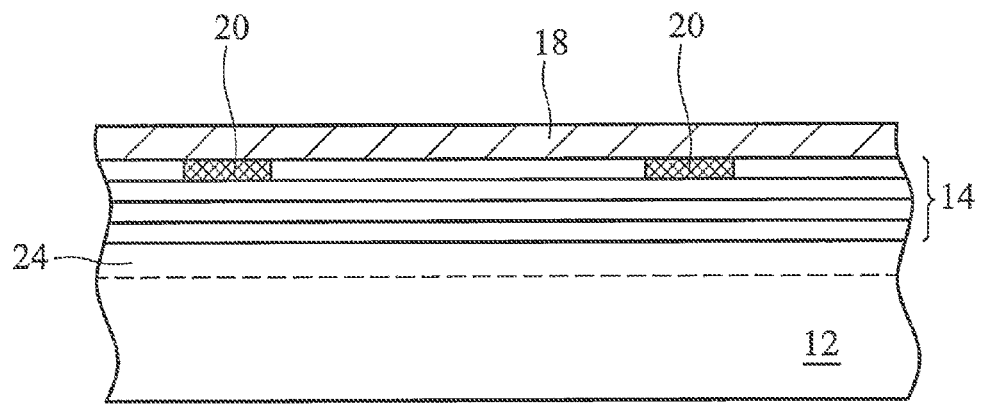
FIGS. 4a and 4b schematically illustrate in cross-sectional view steps in the manufacture of an alternative embodiment of the present invention.
Figure 4B:
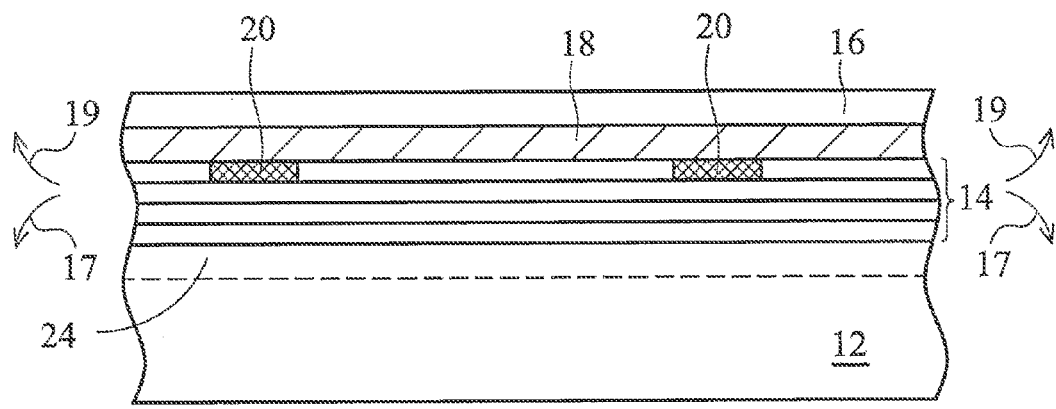

FIGS. 4a and 4b illustrate an alternate embodiment in which stress tuning layer 18 is formed on a top surface of wafer 12, i.e., on top of film 14. As shown in FIG. 3a, stress tuning layer 18 is formed directly atop film 14 after formation of the integrated circuit is otherwise substantially complete. It should be noted that in this illustrated embodiment, stress tuning layer 18 is other than a layer normally associated with fabrication of an integrated circuit. In other words, stress tuning layer 18 should not be confused with a passivation layer or other component layer of film 14 typically formed in the manufacture of an integrated circuit. An advantageous feature of a separate stress tuning layer is to allow stress balancing without sacrificing other properties of the passivation layer. It is, hence, contemplated that the integrated circuit device will have a passivation layer, etc., and will further have stress tuning layer in addition to those other layers. Because stress tuning layer is formed atop film 14 prior to further processing, it may not be necessary to form protective film 16 on the device prior to backgrinding wafer 12. Wafer 12 can then be background or polished to a desired thickness as illustrated by dotted line 24.

In the alternative, after formation of stress tuning layer 18 atop film 14, protective film 16 can be formed directly atop stress tuning layer 18, as illustrated in FIG. 4b. Processing can then continue with wafer 12 being thinned down to a desired thickness, as also shown in FIG. 4b by dotted line 24.

FIG. 4b also shows schematically the stress imposed by film 14 (deflection arrows 17) and stress tuning layer 18 (deflection arrows 19). Note that in this embodiment—where stress tuning layer 18 and film 14 are both formed on the same surface of the substrate, stress tuning layer 18 must impose an opposite stress as that imposed by film 14. In other words, assuming film 14 imparts a tensile stress on wafer 12, stress tuning layer must in this embodiment be selected and deposited so as to impart a compressive stress on wafer 12 in order to off-set or counter balance film 14. Conversely, if film 14 provides an overall compressive stress, stress tuning layer 18 must be selected and deposited to provide a counter-balancing tensile stress.

Figure 5A:
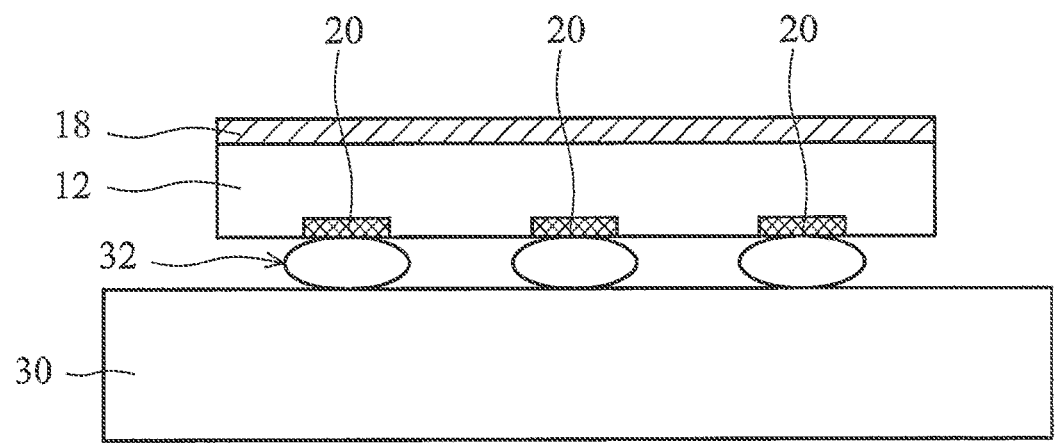
FIGS. 5a and 5b schematically illustrate alternative flip chip packaging embodiments of the present invention.
Figure 5B:
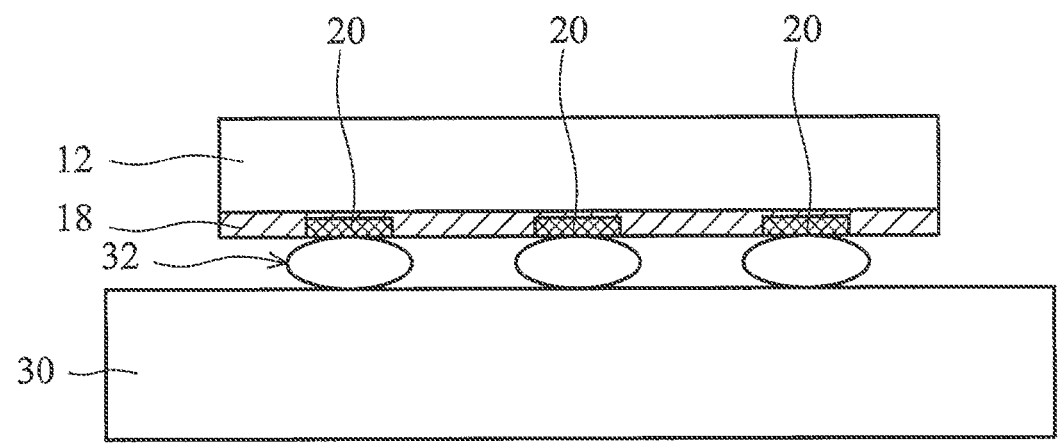

FIGS. 5a and 5b schematically illustrate in cross section an exemplary chip in an integrated circuit package, in this case a so-called flip-chip package. FIG. 5a illustrates a flip-chip package employing a chip manufactured with the stress tuning layer on the back side of wafer 12, such as was illustrated in FIGS. 2a through 2c. Specifically, wafer 12, which has already been thinned as described above, is flipped over so that its top surface faces an underlying supporting substrate 30. Solder bumps or balls 32 formed on substrate 30 are placed so as to align with contact pads 20 of the integrated circuit device. When the device is placed upon these bumps 32, electrical contact is established between the device and the package. Typically, an underfill material (not shown) is injected or otherwise formed in the space between wafer 12 and substrate 30. This underfill material is typically formed in a fluid state and subsequently cured to harden. This underfill may also have a coefficient of thermal expansion and a modulus that differs from wafer 12, thus further contributing to stress applied on wafer 12. Stress tuning layer 18 can be selected and deposited to also counteract the effects of underfill, if appropriate.

FIG. 5b illustrates a flip chip package employing a stress tuning layer 18 on the front surface of wafer 12. In such an embodiment, appropriate openings must be formed in stress tuning layer 18 (as well as in any underlying passivation layer) in order to allow for good mechanical and electrical contact between contact pads 20 and solder bumps 32. Again, an underfill material between wafer 12 and supporting substrate 30 might also contribute to the overall stress imposed on wafer 12—which can be at least partially counteracted by stress tuning layer 18, if appropriate.

Figure 6A:
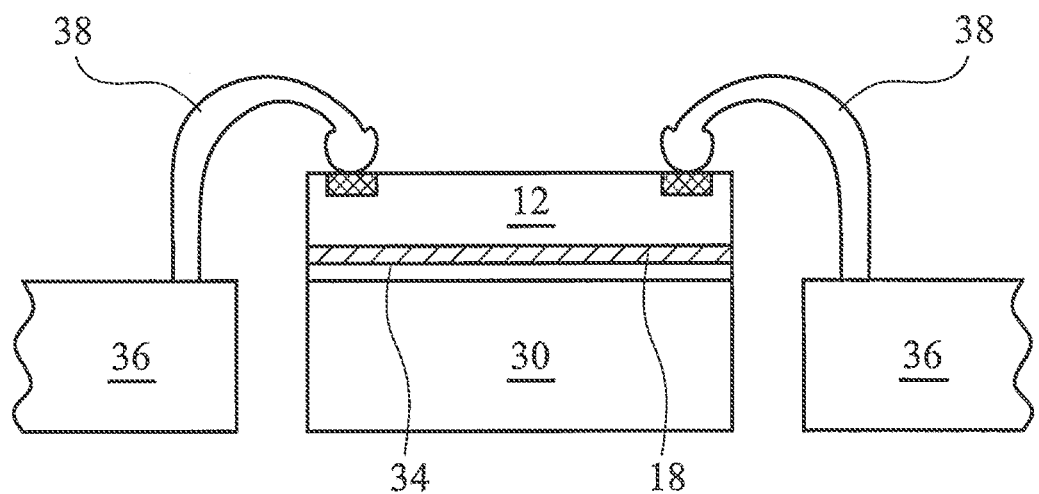
FIGS. 6a and 6b schematically illustrate wire bond packaging embodiments of the present invention.
Figure 6B:
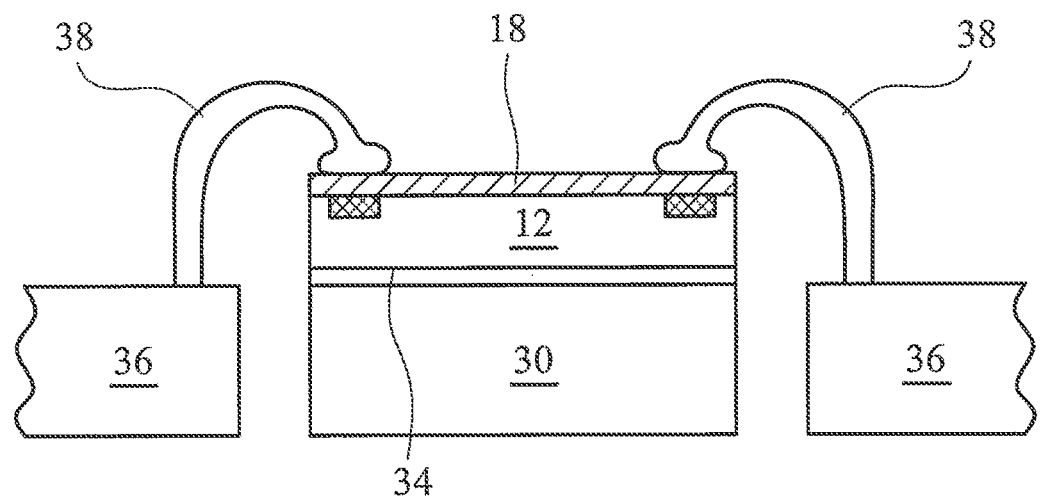

FIGS. 6a and 6b illustrate yet another embodiment in which wafer 12 is placed in a wire bonding package. FIG. 6a illustrates an embodiment wherein stress tuning layer is formed on the back side of wafer 12. In this embodiment, stress tuning layer 18 faces an underlying support substrate 30, such as a lead frame pad. Bond wires 38 contact and electrically connect bond pads 20 to lead fingers 36. Glue or underfill 34 is formed between stress tuning layer 18 and lead pad substrate 30. As discussed above, stress tuning layer may, in some embodiments, be selected and formed so as to offset at least some of the stress otherwise caused by underfill 34. As is known in the art, the entire assembly illustrated in FIGS. 6a (and 6b as will be described below), is encapsulated in a plastic or ceramic package, which package seals and protects the chip from environmental and mechanical factors.

FIG. 6b illustrates a wire bond package with a chip that has had stress tuning layer 18 formed on the front or top surface of wafer 12. Note in this instance that appropriate holes must be formed in stress tuning layer 18 in order that bond wires 38 can contact and electrically connect bond pads 20 to lead fingers 36.

Figure 7:
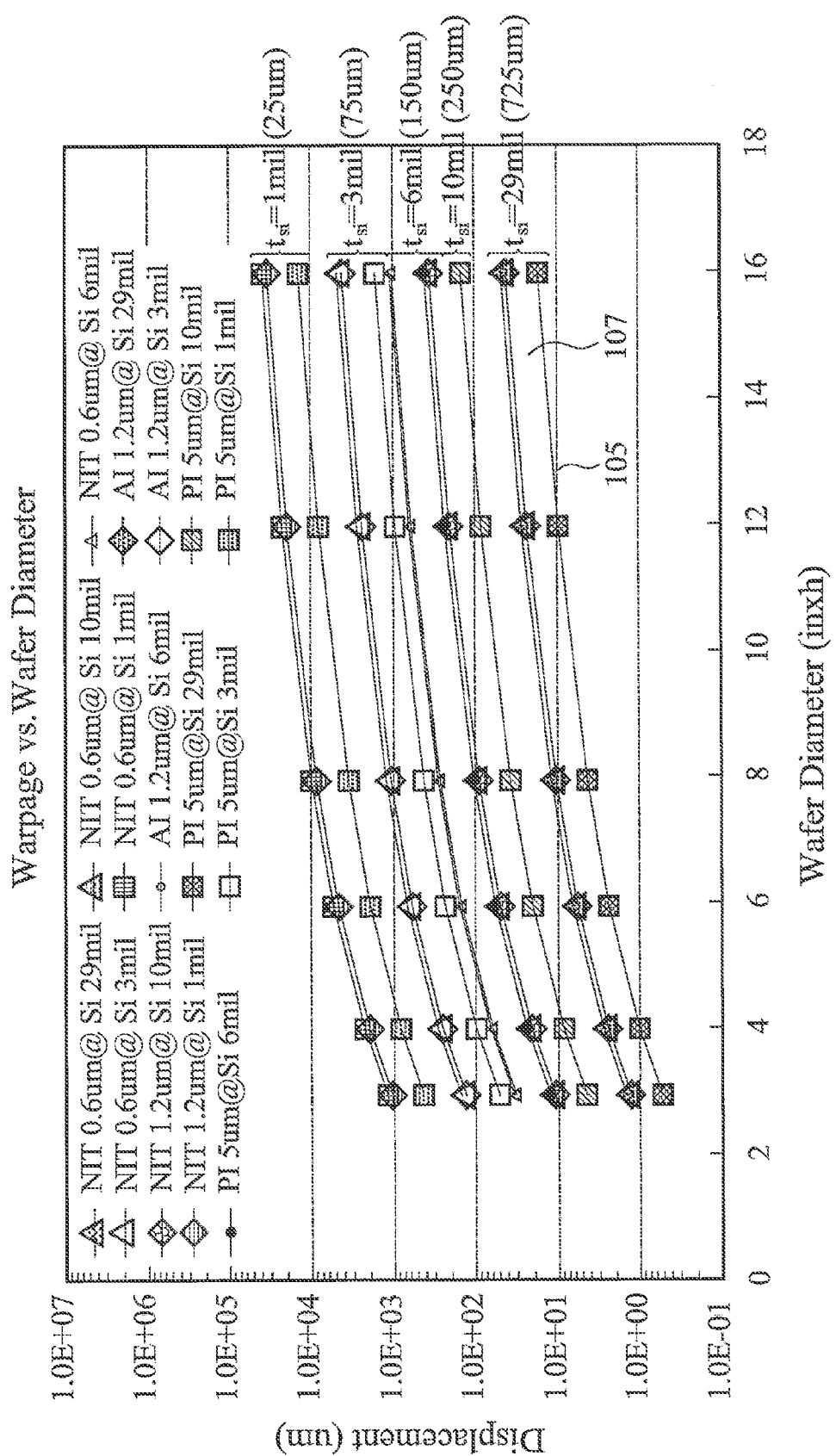
FIG. 7 graphically illustrates the relationship between wafer diameter and warpage imposed by thin films formed on the wafer.

FIG. 7 graphically illustrates the relationship between wafer diameter and the amount of warpage displacement arising from thin films formed on the wafer. As shown by the legend, different thin films, including a nitride film (NIT), aluminum film (Al), and polyimide film (PI) were modeled for wafers ranging from three inches in diameter to sixteen inches in diameter and the amount of resulting warpage was simulated. Simulation was based upon the coefficient of thermal expansion (CTE) mismatch between the thin film and the underlying silicon wafer and the modulus of the film. As is clear, warpage increases by orders of magnitude for relatively thin wafers of, say, 25 µm (see lines 101 and 103) compared to the warpage for relatively thick wafers of 725 µm (see lines 105 and 107). It is this warpage that may be substantially ameliorated by embodiments of the present invention, in the manners described above.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   forming a series of layers on a first surface of a semiconductor substrate, the semiconductor substrate having a second surface opposite the first surface, the semiconductor substrate comprising a plurality of dies;
   forming a stress-tuning layer overlying one of the first and the second surface, wherein the stress-tuning layer is formed at a temperature of less than about 400° C.; and
   forming a slot in the stress-tuning layer, the slot extending over at least two of the plurality of dies.

2. The method of claim 1, wherein the forming the series of layer is performed at least in part with a deposition process at a temperature of at least 400° C.

3. The method of claim 1, wherein the forming the series of layer is performed at least in part with an atomic layer deposition process.

4. The method of claim 1, further comprising depositing a protective layer onto the series of layers prior to the forming the stress-tuning layer.

5. The method of claim 4, further comprising polishing the semiconductor substrate after the depositing the protective layer and prior to the forming the stress-tuning layer.

6. The method of claim 5, further comprising removing the protective layer after the forming the stress-tuning layer.

7. The method of claim 6, further comprising:
   dicing the semiconductor substrate; and
   after the dicing the semiconductor substrate, making electrical connection to bond pads on one of the plurality of dies.

8. A method of forming a semiconductor structure, the method comprising:
   forming a first layer over a semiconductor substrate, the semiconductor substrate comprising a die, a first surface, and a second surface;
   forming a stress-tuning layer on one of the first surface or the second surface; and
   removing a first portion of the stress-tuning layer to form an opening, the opening extending over and beyond the die;
   singulating the die; and
   applying an underfill material to the first surface or the second surface, wherein the stress-tuning layer counteracts stress from the underfill material.

9. The method of claim 8, wherein the semiconductor substrate has a diameter of at least twelve inches.

10. The method of claim 8, wherein the applying the underfill material further comprises:
    applying the underfill material in a fluid state; and
    curing the underfill material after the applying the underfill material.

11. The method of claim 8, wherein the removing the first portion of the stress-tuning layer comprises forming a series of parallel strips.

12. The method of claim 8, wherein the removing the first portion of the stress-tuning layer comprises forming a checkerboard type pattern.

13. The method of claim 8, wherein the forming the stress-tuning layer forms the stress-tuning layer directly atop the first layer.

14. The method of claim 13, further comprising forming a protective layer directly atop the stress-tuning layer.

15. The method of claim 13, further comprising forming openings within the stress-tuning layer to expose bond pads.

16. A method of forming a semiconductor structure, the method comprising:
    forming a first layer over a semiconductor substrate, the semiconductor substrate comprising a die, a first surface, and a second surface;
    forming a stress-tuning layer on one of the first surface or the second surface; and
    removing a first portion of the stress-tuning layer to form a pattern of openings, at least one of the pattern of openings extending over and beyond the die, wherein the pattern of openings is aligned with one or more crystalline orientations of the semiconductor substrate.

17. The method of claim 16, wherein the pattern of openings comprises a series of concentric rings.

18. The method of claim 16, wherein the removing the first portion of the stress-tuning layer comprises removing the stress-tuning layer entirely from a central portion of the semiconductor substrate and leaving one or more annular regions around a periphery of the semiconductor substrate.

19. The method of claim 16, wherein the forming the stress-tuning layer forms the stress-tuning layer in physical contact with a passivation layer.

20. The method of claim 16, wherein the forming the stress-tuning layer forms the stress-tuning layer with a thickness no greater than 20 μm.

\* \* \* \* \*